(12) United States Patent
Tang et al.

(10) Patent No.: US 6,867,587 B2
(45) Date of Patent: Mar. 15, 2005

(54) EXCITATION CIRCUIT FOR A FLUXGATE SENSOR

(75) Inventors: Sai Chun Tang, Galway (IE); Maeve Duffy, Galway (IE); Pavol Ripka, Galway (IE); William Gerard Hurley, Galway (IE)

(73) Assignee: National University of Ireland, Galway, Galway (IE)

( * ) Notice: Subject to any disclaimer, the term of this patent is extended or adjusted under 35 U.S.C. 154(b) by 57 days.

(21) Appl. No.: 10/370,078

(22) Filed: Feb. 21, 2003

(65) Prior Publication Data

US 2003/0178993 A1 Sep. 25, 2003

(30) Foreign Application Priority Data

Feb. 21, 2002 (IE) .......................................... 2002/0131

(51) Int. Cl.[7] .............................................. G01R 33/04
(52) U.S. Cl. ..................................................... 324/253
(58) Field of Search ................................. 324/244, 258, 324/247, 249, 253, 254, 255, 260–262; 33/361

(56) References Cited

U.S. PATENT DOCUMENTS

| | | | | |
|---|---|---|---|---|
| 3,791,043 A | * | 2/1974 | Russell | 33/312 |
| 4,626,781 A | | 12/1986 | Forkel | 324/174 |
| 4,646,015 A | | 2/1987 | Phillips | 324/253 |
| 5,982,253 A | * | 11/1999 | Perrin et al. | 333/182 |
| 6,218,831 B1 | * | 4/2001 | Fowler | 324/253 |
| 6,316,931 B1 | * | 11/2001 | Nakagawa et al. | 324/117 R |
| 6,512,370 B1 | * | 1/2003 | James | 324/253 |

* cited by examiner

*Primary Examiner*—N. Le
*Assistant Examiner*—Reena Aurora
(74) *Attorney, Agent, or Firm*—Jacobson Holman PLLC

(57) ABSTRACT

A fluxgate excitation circuit comprises an excitation inductor having a resistance Rsat and an inductance Lsat. Vin is provided by a half bridge converter of MOSFET switches (S1, S2). The excitation inductor is driven so that it enters saturation at the transition as the excitation cycle passes from positive to negative. Thus, a high input rms current value of the excitation circuit can be achieved. Because the excitation inductor is saturated for part of the cycle it may be much smaller than heretofore and have a smaller power supply. Thus, the circuit finds application in small devices.

13 Claims, 4 Drawing Sheets

Measured magnetic flux versus applied mmf to the current sensor

EXCITATION CIRCUIT FOR A FLUXGATE SENSOR

INTRODUCTION

1. Field of the Invention

The invention relates to fluxgate sensors for magnetic field or current measurement.

2. Prior Art Discussion

Such sensors are used for a variety of magnetic field and current applications. For example, U.S. Pat. No. 4,626,781 describes use of a fluxgate sensor for detection of speed of rotation and/or angle of rotation of a shaft. U.S. Pat. No. 4,646,015 also describes fluxgate sensor and excitation circuit.

The main function of a fluxgate excitation circuit is to periodically saturate the fluxgate core in both directions by applying a symmetric current waveform. A more accurate and sensitive sensor response is obtained for deeper saturation of the core. This is achieved by ensuring that high peak current levels are supplied to the fluxgate. As the response of the fluxgate to external magnetic fields is measured in terms of the level of non-symmetry introduced in the fluxgate voltage, a highly symmetric excitation current source is required.

The excitation current source for a fluxgate sensor typically consists of an ac voltage source connected in series with a large output impedance. The impedance must be larger than the impedance of the fluxgate sensor so that the excitation current is independent of the impedance of the sensor. It is usually realised with either a lossy resistor or a bulky inductor operated in non-saturated mode. When the excitation frequency decreases, the inductor size required increases to achieve a sufficiently high impedance. Since the current delivered from the excitation circuit is inversely proportional to the output impedance value, a high voltage source is needed to supply sufficient current to saturate the fluxgate sensor. Clearly, traditional excitation methods present a barrier to miniaturisation of portable equipment that use fluxgate magnetic sensors, such as electronic compasses and ammeters.

The invention addresses this problem.

SUMMARY OF THE INVENTION

According to the invention, there is provided a fluxgate sensor excitation circuit comprising:

an AC voltage source, and an excitation inductor for connection in series with the fluxgate sensor, wherein the voltage source and the excitation inductor are configured such that the excitation inductor is saturated in use.

In one embodiment, the excitation inductor is saturated for part of each excitation cycle.

In another embodiment, the excitation inductor's non-saturated inductance value is larger than that of a fluxgate sensor.

In a further embodiment, the excitation inductor is saturated at transition to negative current derived from the voltage source.

In one embodiment, the excitation inductor has a high non-saturated inductance value higher than that of a fluxgate sensor being driven by the excitation circuit.

In another embodiment, the excitation circuit comprises output terminals connected to provide second harmonic voltage across the fluxgate sensor as an output voltage representing current or magnetic field sensed by the fluxgate sensor.

In a further embodiment, the resonant frequency of the excitation circuit is lower than the operating frequency of the fluxgate sensor.

In one embodiment, the voltage source comprises a half-bridge of two switches.

In another embodiment, the switches are MOSFET switches.

In a further embodiment, the voltage supply further comprises a DC supply of 3V or less.

In one embodiment, the switches are mounted on the same substrate.

In another embodiment, the switches operate under zero voltage conditions.

In a further embodiment, the power consumption of the excitation circuit is 190 mW or less.

In one embodiment, the invention further comprises a resonant capacitor for connection across a fluxgate sensor.

In another embodiment, the invention further comprises a blocking capacitor in series with the excitation inductor.

In another aspect, the invention provides a fluxgate sensor apparatus comprising a fluxgate sensor and an excitation circuit as defined above.

In one embodiment, the fluxgate sensor comprises two planar layers of toroidal magnetic core embedded in a circuit substrate.

BRIEF DESCRIPTION OF THE DRAWINGS

The invention will be more clearly understood from the following description of some embodiments thereof, given by way of example only with reference to the accompanying drawings in which.

DETAILED DESCRIPTION OF THE INVENTION

Description of the Embodiments

Figure 1:
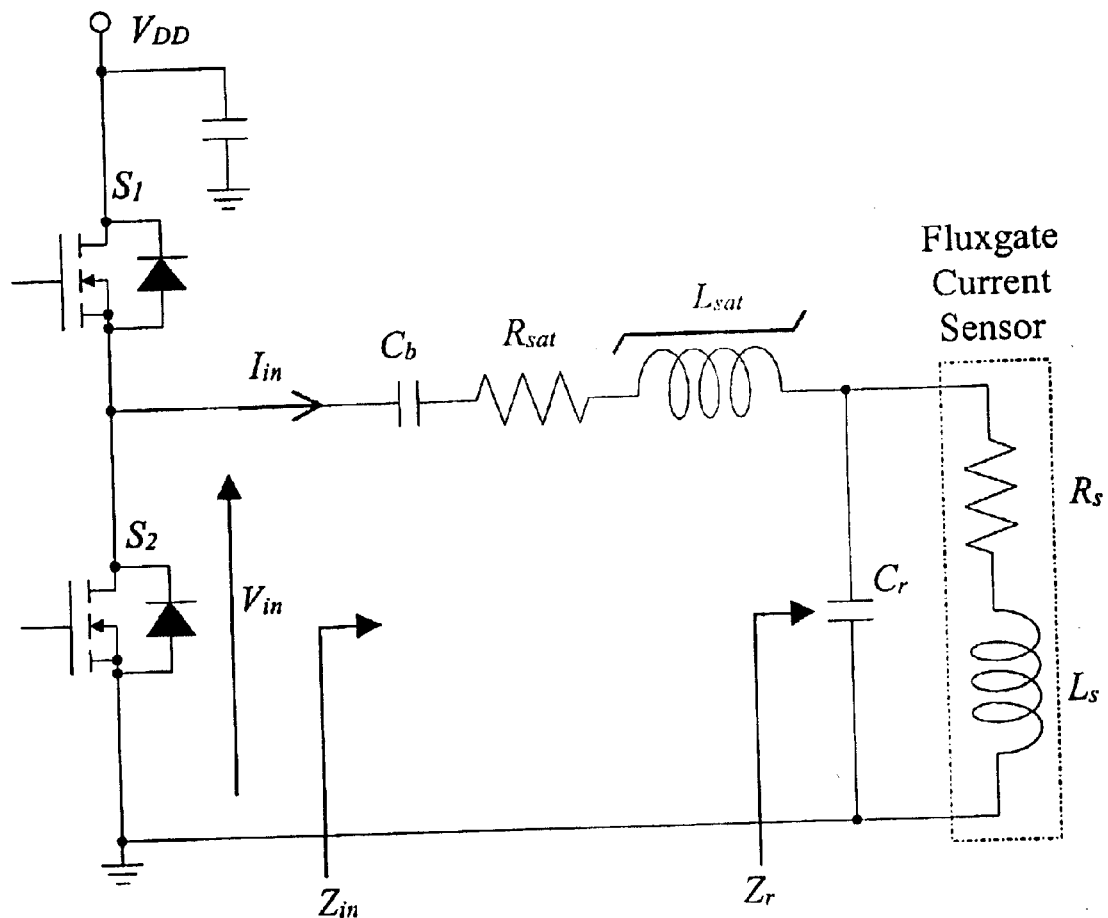
FIG. 1 is an equivalent diagram of a fluxgate sensor and excitation circuit of the invention.

Referring to FIG. 1, the circuit model of a fluxgate sensor comprises a resistor Rs in series with an inductor Ls. An excitation circuit comprises an AC voltage supply Vin providing excitation current through a DC blocking capacitor Cb, and a saturable inductor with resistance Rsat, and inductance Lsat. A symmetric voltage source is provided by using two switches $S_1$ and $S_2$ fabricated in the same package so that their characteristics and operating conditions, such as temperature, are as close as possible. A resonant capacitor Cr is connected in parallel with the fluxgate in order to reduce the current drawn from the source for a given peak current supplied to the fluxgate. A sensor output is provided across the fluxgate sensor, and is monitored by a lock-in amplifier which monitors only second harmonic voltage.

The fluxgate sensor is planar. Two layers of toroidal magnetic core, each with thickness of 20 µm, are electroplated and embedded into a PCB. The outer diameter and the width of the core are 10 mm and 1 mm, respectively. The excitation winding has 40 turns. The coil tracks are etched on the PCB and copper through-holes complete the turns around the toroidal core. A hole is drilled in the PCB at the center of the toroidal core, through which a wire carrying the measurement current is passed. The measurement current offsets the magnetic field in the fluxgate core and a second harmonic voltage is generated due to the asymmetry of the magnetic field. In this case, the excitation coil also acts as a pick up coil. The second harmonic voltage induced on the excitation coil is measured as a function of the amplitude and direction of the measurement current.

Figure 2:
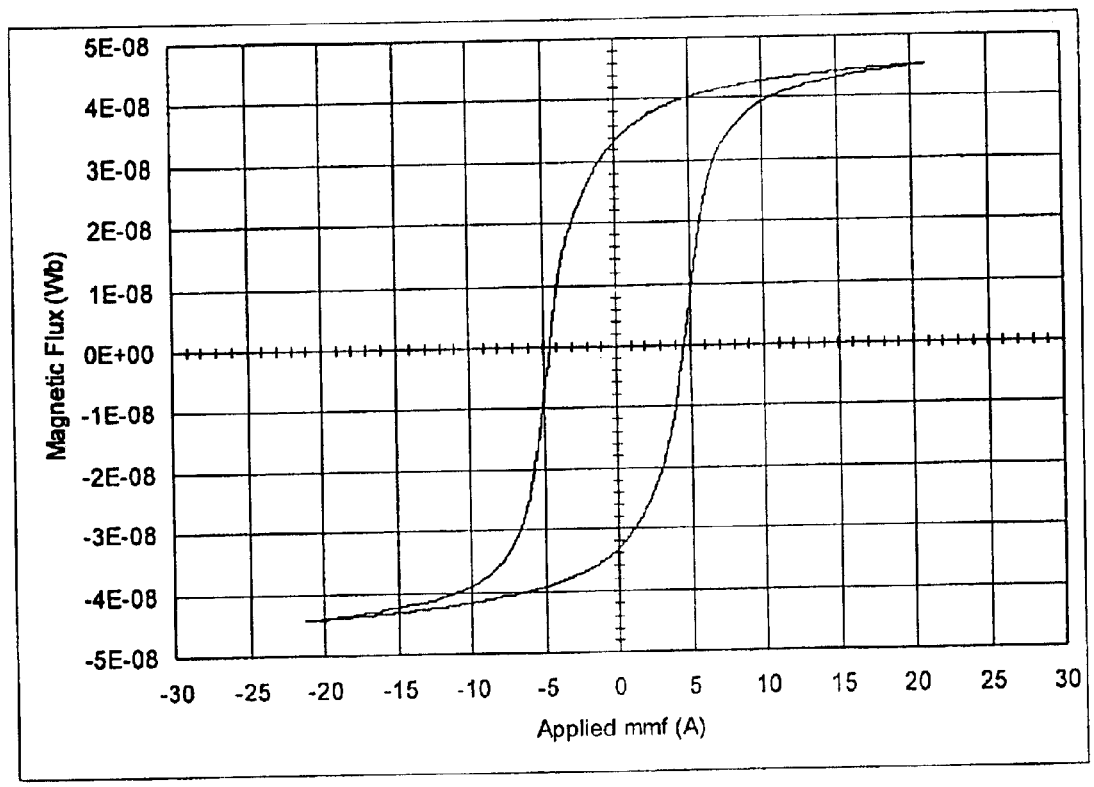
FIG. 2 is B-H plot characterising the fluxgate sensor.

The relationship between the core magnetic field and the applied mmf of the fluxgate sensor is shown in FIG. 2. The frequency of the current source is 50 kHz. A temporary secondary coil of 20 turns is manually wound around the core for magnetic field measurement. The voltage induced on the secondary coil is measured with a digital oscilloscope, and the magnetic field inside the core is found by numerically integrating the secondary voltage instead of using a traditional analog integrator circuit. In this way, errors coming from the phase shift and tolerance of electronic components in the analog integrator circuit are eliminated.

In the excitation circuit, the saturable inductor has the following properties:
- it is operated in the saturated region over part of the excitation cycle;
- its non-saturated inductance value, Lsat, is larger than that of the fluxgate sensor, Ls;
- it is not necessary for the core of the saturable inductor to be deeply saturated during operation; and
- it provides the same energy to the fluxgate as a non-saturable inductor, but with a lower source voltage level, resulting in reduced power consumption of the excitation circuit.

The saturable inductor has a high non-saturated inductance value—it provides a high impedance to the source voltage so that a current source (i.e. independent of changes to the impedance of the fluxgate) is supplied to the fluxgate. For the test circuit, the average inductance of the saturable inductor over one excitation period is 26 uH while that of the fluxgate is 4.3 uH.

Due to the fact that the small saturable inductor is designed to operate in the saturated region over part of the excitation cycle, it may also have one or more of the following properties when compared with a non-saturable inductor having the same inductance value:
- smaller core area;
- lower core losses, due to a reduction in core area and volume;
- larger choice of magnetic core materials, including high permeability materials;
- smaller number of winding turns;
- lower winding resistance; and
- smaller overall physical size.

In this embodiment, the saturable inductor is made of a small size magnetic ring core. Alternatively, it may be implemented in a low-profile planar structure by means of printed circuit or thick film technology. The small size and low supply voltage features are desirable for many portable battery operated electronic equipment using magnetic sensors that are based on the fluxgate principle, such as a digital compass and ammeter.

The capacitor, $C_b$, blocks the dc component of the square voltage and also takes part in the resonant network. The fluxgate sensor is connected in parallel to the resonant capacitor, $C_r$, which provides a high peak current to the fluxgate.

The operating frequency of the circuit is set to 50 kHz, which is limited by the maximum frequency of the lock-in amplifier which is used to measure the $2^{nd}$ harmonic voltage across the fluxgate. The dc supply voltage, $V_{DD}$, can be as low as 3 V, so low voltage rating (30 V) and low turn-on resistance (0.05Ω) IR7303 MOSFETs can be used in the half-bridge circuit. The switches $S_1$ and $S_2$ consist of two same type n-channel MOSFETs, which are fabricated in an SO8 surface mount package, so that their characteristics and operating condition, such as die temperature, can be very close. This arrangement has an advantage of increasing the symmetry of the output square voltage and so the undesired second harmonic content of the square voltage can be suppressed. The MOSFETs, $S_1$ and $S_2$, operate under zero voltage conditions so that energy dissipation due to conduction loss is minimised. The capacitance values of $C_b$ and $C_r$ are 0.47 $\mu$F and 1 $\mu$F, respectively. The measured dc supply current is about 63 mA and the power consumption of the excitation circuit, including the half-bridge and the resonant circuit, is about 190 mW.

The resonant frequency of the excitation circuit is designed to be lower than the operating frequency so the input current, $I_{im}$, flowing into the excitation circuit does not complete half of the resonant period when the next half cycle begins. It implies that when $S_2$ is switched off and $S_1$ is switched on, the saturable inductor is saturated by the reverse current. This arrangement has the advantage that the current delivered from the half-bridge converter has a higher rms value for the same peak current value (or has lower peak current value for the same rms value).

Figure 3:
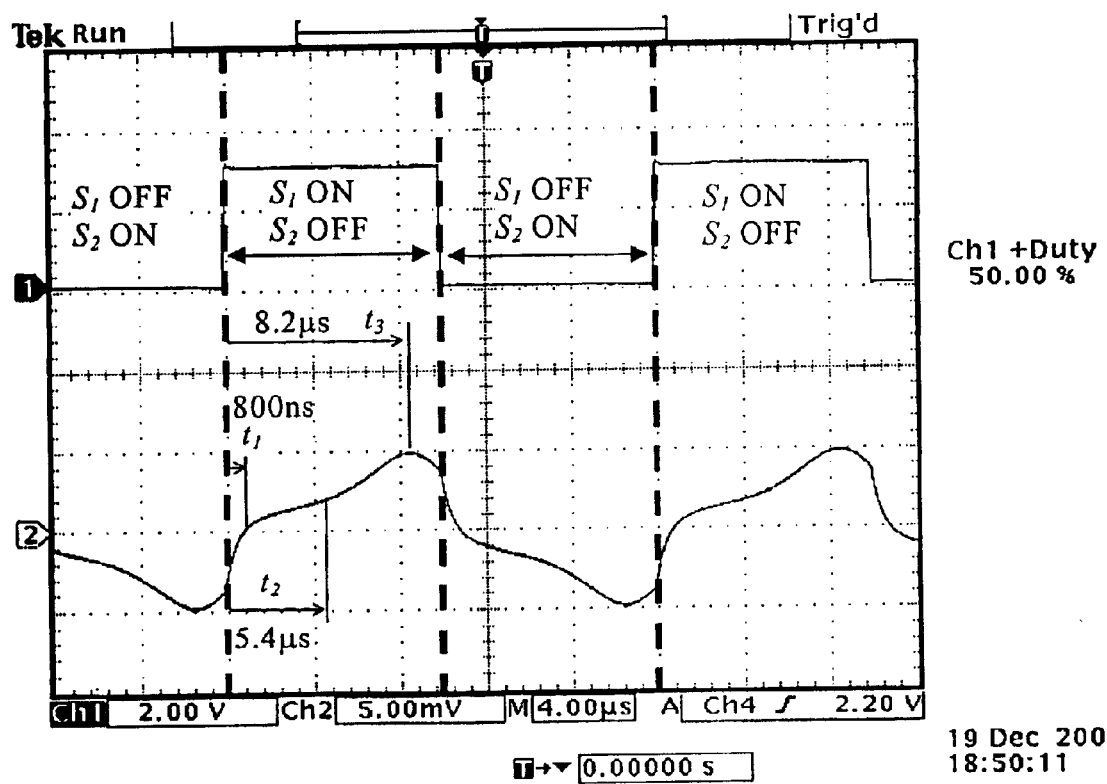
FIG. 3 is a plot of measured Vin (upper track, 2V/div) and Iin (lower track, 0.25 A/div) of the excitation circuit.

When $S_2$ is switched off and $S_1$ is switched on, the output voltage of the half-bridge rises from 0 V to 3 V. At the switching transition, the saturable inductor is saturated by the negative current. Its inductance value is very low so the current increases rapidly from negative to zero ampere after about 800 ns as shown in FIG. 3. In the time interval between $t_1$ and $t_2$, the inductor current becomes positive and is in the non-saturated region so the output current from the half-bridge converter can be limited. The inductor begins to be saturated by the positive current at $t_2$, and at $t_3$ the current increases to its peak value due to the resonant effect. While the inductor current is still high and the saturable inductor is being saturated by the positive current, the negative half-cycle begins (i.e. $S_1$ is off and $S_2$ is on). Thus, a high input rms current value of the resonant circuit can be achieved with the same peak current value. The operation of the positive and negative half cycles is similar and the measured waveforms shown in FIG. 3 are symmetrical.

It should be noted that the saturable inductor has a high non-saturated inductance value to restrain the abrupt increase of current flowing from the half-bridge converter to the resonant network. High current flowing through the MOSFETs could increase the voltage drop across the drain-to-source terminals of the MOSFETs and distort the output voltage of the half-bridge converter. Furthermore, a high rate of change of current could lead to noise and EMI problems that degrade the accuracy of the current sensor.

Figure 4:
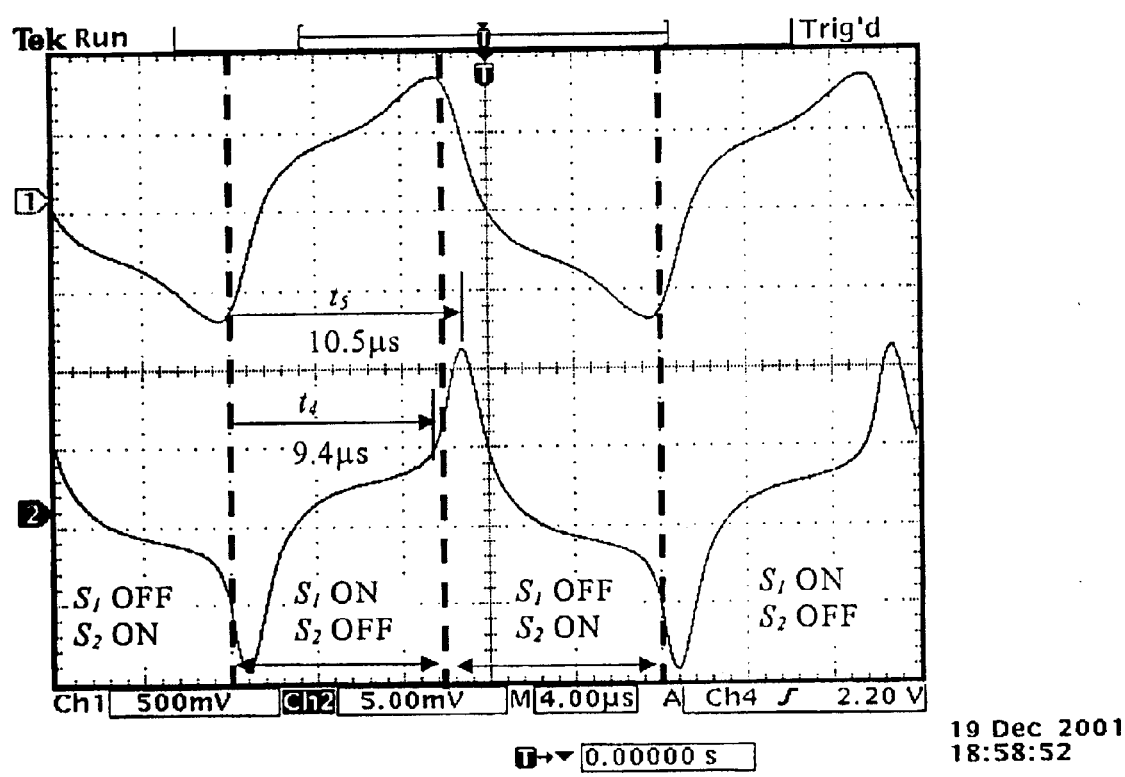
FIG. 4 is a set of plots of measured voltage (upper track, 0.5V/div) and current (lower track, 0.25 A/div) of the fluxgate current sensor.

The measured voltage and current of the fluxgate current sensor are shown in FIG. 4. When $S_1$ is switched on, $C_r$ is charged smoothly as the charging current is limited by $L_{sat}$. At time $t_4$, the sensor current increases to about 0.2 A, the magnetic core inside the fluxgate sensor begin to be saturated. The impedance of the fluxgate sensor then drops rapidly, the resonant capacitor $C_r$ is discharged and desired high peak current of 0.525 A flows into the fluxgate sensor at $t_5$.

Sensitivity of the Fluxgate Sensor using the Proposed Excitation Circuit

Figure 5:
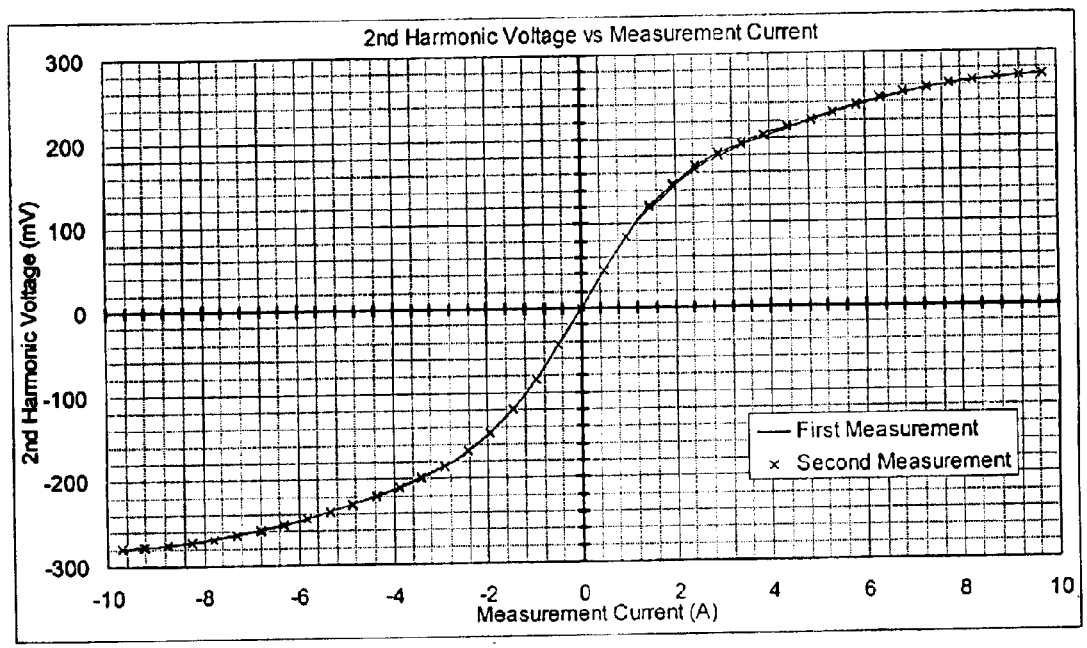
FIGS. 5 and 6 are plots of second harmonic voltage versus sensed current.
Figure 6:
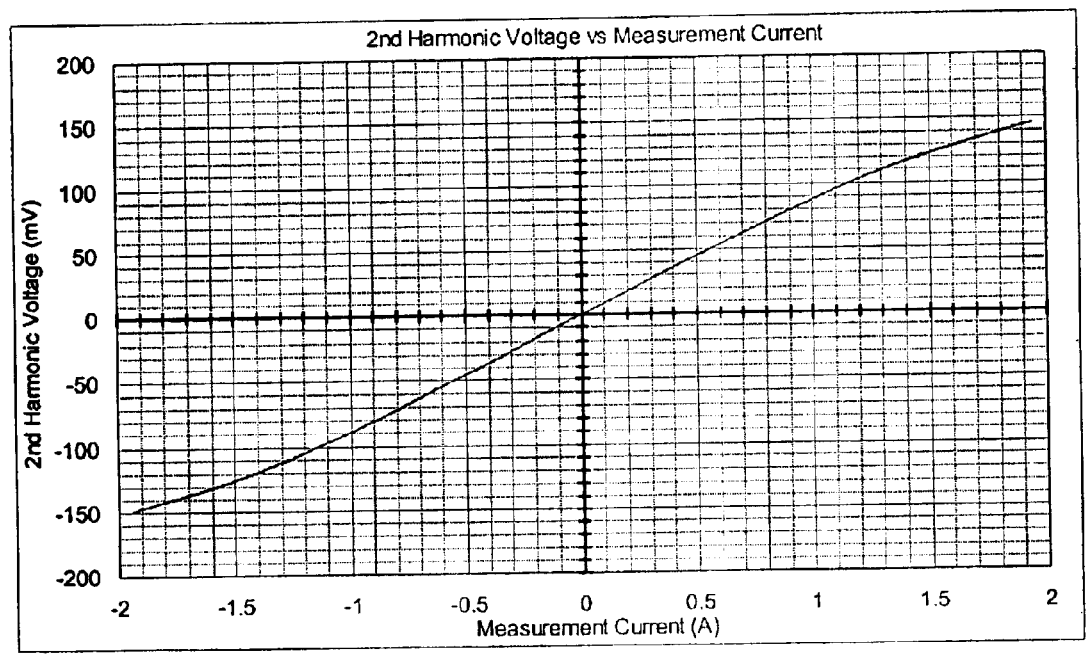

The response of the fluxgate operated as a current sensor, with a dc current flowing in a wire passed through the centre of the fluxgate core, is set out below. The $2^{nd}$ harmonic voltage measured across the excitation winding is measured (twice) and plotted against test dc current as shown in FIG. 5. The test current increases from 0 A to 10 A and then back to 0 A, with 0.5 A current step. Afterwards, the polarity of the measurement current reverses, decreases to −10 A and back to 0 A again. Since the excitation current deeply saturates the fluxgate magnetic core, the measurements in FIG. 5 are repeatable. As the excitation current is symmetric, the measured second harmonic voltage has a negligible offset and is odd-symmetric about the origin. From FIG. 5, the linear region is between about 0 A and +/− 1 A. Measurements of the sensor response with a finer current step of 0.01 A are plotted in FIG. 6. In this case, the test current is from −2 A to 2 A. Results in both FIGS. 5 and 6 show that the sensitivity of the sensor is 90 mV/A in the linear region.

It will be appreciated that the invention provides for use of a much smaller excitation inductor, lower supply voltage and power consumption, and smaller number of switches, thus opening up possibilities for a range of additional applications. Possible applications include compasses for cars, watches, or mobile phones.

Another possible application is DC and low frequency AC current sensing, in which the fluxgate is preferably of the ring-core type in which only the field of a current passing through the ring produces the fluxgate effect. Current sensing may have application in portable electronics that include DC/DC converters. In particular, it would provide advantages of reduced size and power consumption for PCB integrated fluxgate sensors. The saturable inductor could also be designed for integration in PCB thereby further improving performance and possibly reducing circuit size.

Other end applications for miniaturised fluxgates include magnetic ink reading, detection of ferromagnetic objects; e.g. traffic control, reading of magnetic labels, position tracking in virtual reality and robots. The circuit may also be applied in flipping circuits for magnetoresistive (AMR, GMR) sensors. In that case, magnetic material regions in the sensor need to have their internal magnetisation direction reversed. This is achieved by applying high-level current pulses to flipping coils in the vicinity of the magnetic regions. This would introduce another range of end users for the circuit/patent and would include magnetic sensing in a wide range of automotive and industrial applications.

It will also be appreciated that the invention achieves a good linear relationship between the second harmonic voltage and the current being sensed. This allows direct output of results without intermediate processing.

The invention is not limited to the embodiments described but may be varied in construction and detail.

What is claimed is:

1. A fluxgate sensor excitation circuit comprising:
an AC voltage source, and
an excitation inductor for connection in series with the fluxgate sensor, wherein
the voltage source and the excitation inductor are configured such that the excitation inductor is saturated in use;
the excitation inductor is saturated for part of each excitation cycle; and
the excitation inductor's non-saturated inductance value is larger than that of a fluxgate sensor.

2. The fluxgate sensor excitation circuit as claimed in claim 1, wherein the excitation circuit comprises output terminals connected to provide second harmonic voltage across the fluxgate sensor as an output voltage representing current or magnetic field sensed by the fluxgate sensor.

3. The fluxgate sensor excitation circuit as claimed in claim 1, wherein the voltage source comprises a half-bridge of two switches.

4. The fluxgate sensor excitation circuit as claimed in claim 3, wherein the switches are MOSFET switches.

5. The fluxgate sensor excitation circuit as claimed in claim 4, wherein the voltage supply further comprises a DC supply of 3V or less.

6. The fluxgate sensor excitation circuit as claimed in claim 3, wherein the switches operate under zero voltage conditions.

7. The fluxgate sensor excitation circuit as claimed in claim 1, wherein the power consumption of the excitation circuit is 190 mW or less.

8. The fluxgate sensor excitation circuit as claimed in claim 1, further comprising a resonant capacitor for connection across a fluxgate sensor.

9. The fluxgate sensor excitation circuit as claimed in claim 1, further comprising a blocking capacitor in series with the excitation inductor.

10. The fluxgate sensor apparatus comprising a fluxgate sensor driven by an excitation circuit of claim 1.

11. A fluxgate sensor excitation circuit comprising:
an AC voltage source, and
an excitation inductor for connection in series with the fluxgate sensor, wherein
the voltage source and the excitation inductor are configured such that the excitation inductor is saturated in use;
the excitation inductor is saturated for part of each excitation cycle; and
the excitation inductor is saturated at transition to negative current derived from the voltage source.

12. The fluxgate sensor excitation circuit as claimed in claim 11, wherein the resonant frequency of the excitation circuit is lower than the operating frequency of the fluxgate sensor.

13. A fluxgate sensor excitation circuit comprising:
an AC voltage source, and
an excitation inductor for connection in series with the fluxgate sensor, wherein
the voltage source and the excitation inductor are configured such that the excitation inductor is saturated in use;
the excitation inductor is saturated for part of each excitation cycle; and
the excitation inductor has a high non-saturated inductance value higher than that of a fluxgate sensor being driven by the excitation circuit.

* * * * *